United States Patent [19]

Matsunaga et al.

[11] 4,430,664
[45] Feb. 7, 1984

[54] GLASS-MOULDED TYPE SEMICONDUCTOR DEVICE

[75] Inventors: Akira Matsunaga; Keiichi Morita, both of Hitachi, Japan

[73] Assignee: Hitachi, Ltd., Tokyo, Japan

[21] Appl. No.: 187,628

[22] Filed: Sep. 16, 1980

Related U.S. Application Data

[63] Continuation-in-part of Ser. No. 911,309, Jun. 1, 1978, abandoned.

[30] Foreign Application Priority Data

Jun. 6, 1977 [JP] Japan ............................ 52-65785
May 31, 1978 [GB] United Kingdom ............. 25535/78
Jun. 5, 1978 [DE] Fed. Rep. of Germany ....... 2824606

[51] Int. Cl.³ ............... H01L 23/30; H01L 29/34; H01L 23/02; H01L 23/42
[52] U.S. Cl. ............................ 357/73; 357/54; 357/76; 357/79; 357/81; 174/52 H; 65/36; 65/52; 65/53; 65/54; 65/60.8
[58] Field of Search ............... 357/73, 54, 79, 81, 357/76; 174/52 H; 65/36, 60.8, 52, 53, 54

[56] References Cited

U.S. PATENT DOCUMENTS

| 1,968,854 | 8/1934 | Pirani et al. | 65/60.8 |
| 3,250,631 | 5/1966 | Lusher | 65/36 |
| 3,261,075 | 7/1966 | Carman | 357/73 |
| 3,271,124 | 9/1966 | Clark | 357/73 |
| 3,341,649 | 9/1967 | James | 357/73 |
| 3,368,024 | 2/1968 | Bishop | 174/52 H |
| 3,436,109 | 4/1969 | Loose | 65/36 |
| 3,913,127 | 10/1975 | Suzuki et al. | 357/73 |
| 3,996,602 | 12/1976 | Goldberg et al. | 357/73 |
| 4,059,837 | 11/1977 | Suzuki et al. | 357/73 |

FOREIGN PATENT DOCUMENTS 45-25814 8/1970 Japan ................................ 357/73

Primary Examiner—Andrew J. James
Assistant Examiner—Seth Nehrbass
Attorney, Agent, or Firm—Antonelli, Terry & Wands

[57] ABSTRACT

A glass-moulded type semiconductor device comprising semiconductor arrangement composed of at least one semiconductor pellet having at least one P-N junction, edges of which are exposed to peripheral surfaces of the semiconductor pellet, a pair of electrodes secured to opposite ends of the semiconductor arrangement through a brazing material, a first mould glass layer secured to the entire circumferential surface of the semiconductor arrangement and extending to the surfaces of the electrodes for passivating the P-N junction of the semiconductor arrangement, and a second mould glass in the form of at least one layer secured to the surface of said first mould glass layer.

Thermal expansion coefficient of each of the mould glass layers is selected in such a manner that the thermal expansion coefficient of the first glass layer is larger than the apparent thermal expansion coefficient of a semiconductor assembly consisting of the semiconductor arrangement and the brazing material, and the thermal expansion coefficient of said second mould glass layer is larger than that of the first mould glass layer.

1 Claim, 3 Drawing Figures

GLASS-MOULDED TYPE SEMICONDUCTOR DEVICE

CROSS-REFERENCE TO RELATED APPLICATION

This is a continuation-in-part application of the copending U.S. application Ser. No. 911,309 filed on June 1, 1978 now abandoned.

BACKGROUND OF THE INVENTION

This invention relates to a glass-moulded type semiconductor device wherein a semiconductor pellet is airtightly moulded with glass in a sufficient thickness in a thermal-stress-free fashion.

Today, widespread use has been made of a semiconductor device having a semiconductor pellet moulded with glass in place of resin such as epoxy resin.

This is because glass is superior to resin in thermostability and water-proof properties.

A glass-moulded type semiconductor device is typically manufactured through the following processes. Electrodes are brazed to opposite ends of a semiconductor arrangement composed of at least one semiconductor pellet having at least one P-N junction through brazing material. The composition of the at least one semiconductor pellet, the brazing material and the electrodes is referred to as a rectifier unit member hereinafter. A glass slurry is prepared by mixing in distilled water glass powder which has proper electrical charging ability and the ability to facilitate passivation of an exposed surface of the P-N junction exposed to periphery surface of the semiconductor pellet. The rectifier unit member is wrapped with the glass slurry and is then placed in a heating furnace in which the glass is sintered to complete a glass-moulded semiconductor.

It is common to use, as a moulding glass, borosilicate glass or zinc borosilicate glass.

This type of glass-moulded semiconductor device, however, sometimes encounters the problems of damage of the semiconductor pellet and the glass mould. In this glass-moulded type semiconductor device, an axial stress $\sigma_g$ affecting to the mould glass is represented by the following equation:

$$\sigma_g = \frac{Esi \cdot Asi}{Esi \cdot Asi + Eg \cdot Ag} \cdot Eg(\alpha_{si} - \alpha_g)\Delta T \quad (1)$$

where $\alpha_{si}$ shows an apparant thermal expansion coefficient of a semiconductor assembly composed of the at least one semiconductor pellet and the brazing material, $\alpha_g$ a thermal expansion coefficient of the mould glass, Esi Young's modulus of the semiconductor assembly, Eg Young's modulus of the mould glass, Asi a cross-sectional square of the semiconductor assembly, Ag a cross-sectional square of the mould glass, and $\Delta T$ a difference in temperature between the semiconductor assembly and the mould glass.

Supposing the values $\alpha_{si}$, Esi, Asi and $\Delta T$ are constants, there are three methods for decreasing the thermal stress $\sigma_g$ affecting the mould glass to prevent a breakage thereof:

(1) Decreasing the thermal expansion coefficient of the mould glass $\alpha_g$ so as to be as close to that of the semiconductor assembly $\alpha_{si}$ as possible;

(2) Decreasing Young's modulus of the mould glass Eg as much as possible; and (3) enlarging the cross-sectional square of the mould glass Ag as much as possible.

The first method as described above is shown, for example, in U.S. application Ser. No. 673,530 "GLASS-MOULDED TYPE SEMICONDUCTOR DEVICE" by K. Suzuki, T. Sasaki and M. Matsuzaki, filed on Apr. 5, 1976, issued on Nov. 22, 1977 as U.S. Pat. No. 4,059,837, and assigned to the common assignee as the present application, wherein in a glass-moulded type semiconductor device as aforementioned, the thermal expansion coefficient of the mould glass is made close to and not smaller than that of the rectifier unit member. However, there is a lower limit to the amount of decrease in the thermal expansion coefficient of the semiconductor assembly which is possible so as to be close to that of the mould glass.

It is to be noted that, generally, the crystallization of the glass proceeds as the sintering temperature approaches the crystallization peak temperature of the glass, and then the thermal expansion coefficient thereof decreases as the crystallization of the glass proceeds.

But, due to the general nature of glass, the viscosity of this glass is decreased as the sintering temperature increases.

Accordingly, glass slurry wrapped about the rectifier unit member tends to flow down from the rectifier unit member under its own weight when heated to a possibly high temperature accompanied by a reduction in its viscosity. Thus, the glass layer is thinned in part and the thin part becomes weak in its mechanical strength, causing fracture of the glass moulding under the application of thermal stress.

When sintered at a lower temperature, the glass mould is prevented from flowing down to thereby permit formation of a thick glass layer but, in this case, the thermal expansion coefficient difference between the mould glass and rectifier unit member becomes large. As a result, the thermal stress occurring during or after sintering the mould glass increases thereby causing the mould glass or the semiconductor pellet to be damaged.

The reason for causing damage or fracture to the semiconductor pellet is as follows. In the process of cooling the mould glass after sintering it, the mould glass contracts much more than the semiconductor pellet since the thermal expansion coefficient of the mould glass is larger than that of the semiconductor pellet, so that the mould glass applies a compression stress to the semiconductor pellet after completion of the moulding process. However, when the semiconductor device is conducting electricity, Joule heat generated by the current conduction causes the mould glass to expand much more than the semiconductor pellet, so that the expanded mould glass applies a tension stress to the semiconductor pellet.

The semiconductor pellet is generally high in mechanical strength against a compression stress but very low against a tension stress. Thus the semiconductor pellet is apt to be damaged due to the tension stress during a conduction operation thereof.

The second method as described above has such a drawback that it is difficult to arrange the components of the mould glass so as to decrease Young's modulus thereof.

In the third method as described above, it is difficult to form a thick glass layer without increasing the thermal expansion coefficient thereof since the glass slurry tends to flow down when sintered at a higher temperature as described above. Especially, in high-voltage semiconductor devices, the cross-sectional square of the semiconductor pellet becomes larger and so the cross-sectional square of the mould glass is required to be larger thereby making it more and more difficult to form the mould glass with a sufficient thickness.

In coping with this problem, a glass-moulded type semiconductor device was proposed by the disclosure of Japanese Patent Publication No. 52-3274 entitled "GLASS SEAL METHOD FOR SEMICONDUCTOR DEVICES", filed and published on Dec. 18, 1972 and Jan. 27, 1977 respectively, assigned to HITACHI, LTD., wherein one glass slurry is wrapped about a semiconductor assembly including at least one semiconductor pellet and is then sintered to form a first mould glass, and a further glass slurry is wrapped about the first mould glass and sintered to form a second mould glass, whereby a double layer mould glass is formed having an increased thickness to intensify resistance against thermal stress.

However, it has been more and more difficult in the field of semiconductor devices, especially high voltage semiconductor devices, to coat with a glass slurry on a semiconductor assembly including at least one semiconductor pellet in a desired thickness sufficient for preventing the breakage of the mould glass due to the thermal stress even if a double layer mould glass is formed because it has been required in high voltage semiconductor devices to decrease the outer diameter of the semiconductor pellets and to increase the number of the semiconductor pellets or increase the thickness of each pellet thereby increasing the longitudinal length of the semiconductor assembly.

SUMMARY OF THE INVENTION

An object of the present invention is to eliminate the aforementioned drawbacks of the prior art glass-moulded type semiconductor devices.

Another object of the present invention is to provide a glass-moulded type semiconductor device having a mould glass with a sufficient mechanical strength against thermal stress and with a small outer diameter.

According to the present invention, there is provided a glass-moulded type semiconductor device comprising a semiconductor arrangement composed of at least one semiconductor pellet having at least one P-N junction edge which is exposed to peripheral surfaces of the semiconductor pellet, a pair of electrodes secured to opposite ends of the semiconductor arrangement through a brazing material, a first mould glass layer secured to the entire circumferential surface of the semiconductor arrangement and extending to the surfaces of the electrodes for passivating the P-N junction of the semiconductor arrangement, and a second mould glass in the form of at least one layer secured to the surface of said first mould glass layer.

The thermal expansion coefficient of each of the mould glass layers is selected in such a manner that the thermal expansion coefficient of the first glass layer is larger than the apparent thermal expansion coefficient of a semiconductor assembly consisting of the semiconductor arrangement and the brazing material, and the thermal expansion coefficient of said second mould glass layer is larger than that of the first mould glass layer.

By selecting the thermal expansion coefficients of the first and second mould glass layers as described above, thermal stress is divided and absorbed between the first and second mould glass layers thereby increasing the mechanical resistance in each of the semiconductor pellet and the mould glass layer against thermal stress.

Namely, by selecting the thermal expansion coefficient of the first mould glass to be larger than that of the semiconductor assembly, the first mould glass contracts much more than the semiconductor assembly in the process of cooling the first mould glass layer after sintering it thereby completing the moulding process with applying a compression stress to the semiconductor assembly. The semiconductor pellet is high in mechanical strength thereof against a compression stress but very low against a tension stress, so that the semiconductor pellets are not damaged in the sintering process. Further, by selecting the thermal expansion coefficient of the second mould glass to be larger than that of the first mould glass, the second mould glass contracts much more than the first mould glass in the process of cooling the second mould glass layer after sintering it thereby applying a compression stress to the first mould glass. Thus, after completion of sintering the mould glass layers, the second mould glass layer and the first mould glass layer respectively apply compression stresses to the first mould glass layer and the semiconductor assembly. Thus, in the conduction state of the semiconductor device, Joule heat generated by the semiconductor pellet tends to cause the first mould glass to expand much more than the semiconductor assembly thereby applying a tension stress to the semiconductor assembly. However, in this case, the second mould glass still applies a compression stress to the first mould glass even in the conductive state of the semiconductor device since Joule heat is little transmitted to the second mould glass layer. Thus, the second mould glass suppresses the extension of the first mould glass thereby also suppressing the extension of the semiconductor pellet.

Thus, the thickness of the mould glass necessary for obtaining a sufficient mechanical resistance can be decreased when compared with that of the prior art semiconductor devices thereby attaining a semiconductor device with a small outer diameter.

DESCRIPTION OF THE PREFERRED EMBODIMENT

Figure 1:
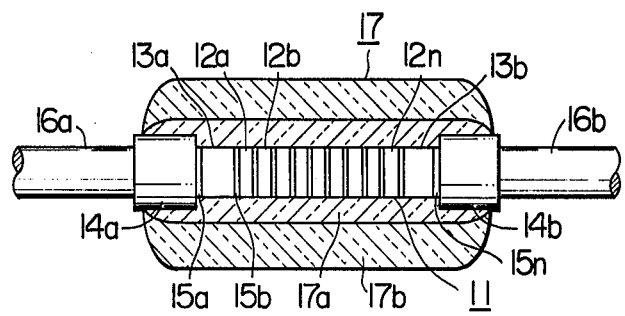
FIG. 1 is a longitudinal sectional view of a first embodiment of a glass moulded type semiconductor deevice according to the invention.

Referring now to FIG. 1 showing a typical embodiment of a glass-moulded type semiconductor device according to the invention, a rectifier unit member generally designated at numeral 11 comprises, for exampe, a semiconductor arrangement composed of at least one silicon pellets $12a$, L $12b$, - - -, $12n$ having each at least one P-N junction, edges of which are exposed to peripheral surfaces of the semiconductor pellet, silicon spacers $13a$ and $13b$ having no P-N junction, electrodes $14a$ and $14b$ made of molybdenum or tungsten having a thermal expansion coefficient of $4.9 \times 10^{-6}/°C$. and of $4.4 \times 10^{-6}/°C$., respectively, which is close to the thermal expansion coefficient of $3.52 \times 10^{-6}/°C$. of silicon, brazing materials $15a$, $15b$, - - -, $15n$ made of, for example, aluminum solder having a thermal expansion coefficient of $2.6 \times 10^5/°C$. for bonding together the above component members in a lamination fashion, and leads 16a and 16b made of copper having a thermal expansion coefficient of $16 \times 10^{-6}/°C$. or copper alloy and welded to the electrodes 14a and 14b, respectively. A first mould glass 17a is sintered to wrap the entire circumferential surface of the semiconductor arrangement and the spacers, and it extends to the surfaces of the electrode. A second mould glass 17b is sintered to wrap the first mould glass 17a, completing a moulded glass structure 17. The first mould glass has the ability of facilitating passivation of the silicon pellet and is secured to the rectifier unit member 11 to airtightly seal the same. The silicon pellets, the silicon spacers and the aluminum solder compose a semiconductor assembly. An apparent thermal expansion coefficient of the semiconductor assembly is made close to the thermal expansion coefficient of silicon by varying thicknesses of the spacers 13a and 13b and aluminum solder. The silicon spacer may be preferably connected to one side or both sides of the semiconductor arrangement through the brazing material. The spacer primarily has the following two functions. First, the spacer prevents voids, which are generated in the mould glass, particularly apt to be generated near the boundaries between the electrodes and the semiconductor arrangement, in the process of sintering, from badly affecting the P-N junctions. The spacer has a second function of preventing a longitudinal stress from being applied to the semiconductor pellets near the contact portion of the electrodes and the semiconductor assembly.

Now, the second mould glass layer may preferably be secured substantially only to the entire surface of the first mould glass layer, or secured not only to the entire surface of the first mould glass layer but also only to the portion of the semiconductor arrangement composed of at least one semiconductor pellet where the first mould glass layer is not covered. That is, the second glass layer or any subsequent layers are not secured to the lead wires. If the second mould glass layer were to be secured to the lead wires, which it is not, the deformation of the lead wire which is due to thermal stress may apply large stress factors to the first glass layer and to the semiconductor arrangement through the second mould glass layer to thereby destroy or damage them. Furthermore, the second mould glass layers which is secured to the lead wires may crack when the lead wire is bent.

An example of the structural dimensions of the semiconductor assembly are as follows: the pellet 12 has a thickness of 300 microns and a diameter of 2 mm; and the brazing material 15 has a thickness of 10 microns. The semiconductor assembly thus has an apparent thermal expansion coefficient of $3.8 \times 10^{-6}/°C$., and the semiconductor device with the moulded glass structure has a diameter of 4 to 6 mm.

Thermal expansion coefficient $\alpha_a$ of the first mould glass layer 17a is made closer to the thermal expansion coefficient $\alpha_s$ of the semiconductor assembly than thermal expansion coefficient $\alpha_b$ of the second mould glass layer 17b.

Namely, these thermal expansion coefficients are related to each other by the following expression:

$$\alpha_s < \alpha_a < \alpha_b.$$

In order to prepare the mould glass layers 17a and 17b having thermal expansion coefficient which satisfy the above expression, the following three processes, for example, may be employed.

(1) Different types of glass having different thermal expansion coefficients are sintered at the same sintering temperature.

Example: Crystallizing glass is used for a first mould glass 17a and non-crystallizing glass is used for a second mould glass 17b. In general, the thermal expansion coefficient of glass is decreased as the crystallization proceeds.

Mould glass may be classified into crystallizable-type glass and non-crystallizable-type glass. The crystallizable-type glass is usually sintered at a temperature near to its crystallization temperature, resulting in enhancing the crystallization and a low thermal expansion coefficient of the moulded glass produced, while the non-crystallizable-type glass has a higher crystallization temperature so that it is hardly subjected to crystallization when sintered at the same temperature as that for the crystallization-type glass, resulting in a higher thermal expansion coefficient of the produced glass mould. The crystallizable-type glass includes crystallizing glass which will be crystallized at a crystallizing peak temperature around 700° C. and non-crystallizing glass which will not be crystallized around 700° C. but will be crystallized at a crystallizing peak temperature around 800° C.

Figure 2:
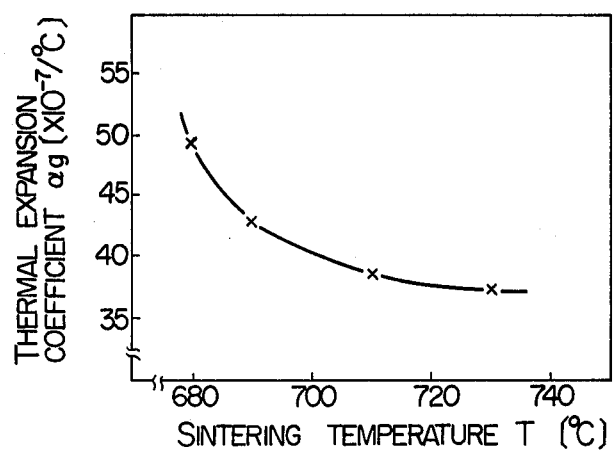
FIG. 2 is a graph showing the relation between sintering temperature and thermal expansion coefficient of crystallizable-type glass.

When the non-crystallizing glass is used for the second mould glass layer and sintered at the same temperature as the first mould glass layer of crystallizing glass, the first mould glass layer can have a smaller thermal expansion coefficient than that of the second mould glass layer. FIG. 2 shows an example of correlation between sintering temperature T and thermal expansion coefficient $\alpha_g$ of crystallizable-type glass containing main compositions of ZnO, $B_2O_3$ and $SiO_2$. This crystallizable-type glass has a crystallizing peak temperature of 720° to 730° C. and its thermal expansion coefficient is decreased as the sintering temperature comes near the crystallizing peak temperature. In this example, crystallizing glass is exemplified as containing 60.0 W % ZnO, 20.5 W % $B_2O_3$, 8.09 W % $SiO_2$, 4.85 W % PbO, 0.35 W % $Al_2O_3$, 0.4 W % $Sb_2O_3$, and 0.05 W % $SnO_2$; non-crystallizing glass is exemplified as containing 63.2 W % ZnO, 20.5 W % $B_2O_3$, 9.39 W % $SiO_2$, 4.29 W % PbO, 0.08 W % $Al_2O_3$, 0.48 W % $Sb_2O_3$, and 0.09 W % SnO; and both of the crystallizing glass and non-crystallizing glass are sintered at 700° C., thus preparing a first mould glass layer having a thermal expansion coefficient of $4.0 \times 10^{-6}/°C$. and a second mould glass layer having a thermal expansion coefficient of $4.5 \times 10^{-6}/°C$.

(2) The same type of glass is used with additives for varying thermal expansion coefficient admixed with one of the mould glass layers 17a and 17b and sintered at the same temperature.

Example: A second mould glass layer 17b is prepared by using glass containing 63.2 W % ZnO, 20.5 W % $B_2O_3$, 9.39 W % $SiO_2$, 4.29 W % PbO, 0.476 W % $Sb_2O_3$, 1.23 W % $SnO_2$ and 0.087 W % $Al_2O_3$; and a first mould glass layer 17a is prepared by using glass admixed with additive of $PbTiO_3$ containing 55.38 W % ZnO, 15.22 W % $B_2O_3$, 7.5 W % $SiO_2$, 3.4 W % PbO, 0.39 W % $Sb_2O_3$, 0.48 W % $SnO_2$ and 14 W % $PbTiO_3$. The first mould glass layer has a thermal expansion coefficient of $4.0 \times 10^{-6}/°C$. and the second mould glass layer has a thermal expansion coefficient of $4.5 \times 10^{-6}$/°C. The thermal expansion coefficient may be reduced by additive of $2ZnO-SiO_2$, $ZnO$, $ZnO-B_2O_3$ or $ZnO_2$ in place of $PbTiO_3$. By adding additive such as $PbTiO_3$ in the mould glass, it is possible to decrease the thermal expansion coefficient of the mould glass as well as to increase the mechanical resistance thereof against thermal stress. The additive may be mixed in any of the first and second mould glass. (3) The same crystallizable-type glass is used and the sintering temperature is varied with mould glass layers 17a and 17b.

Example: $ZnO-B_2O_3-SiO_2$ system glass slurry was wrapped about a rectifier unit member and sintered at 700° C. for 5 minutes to form a first mould glass layer 17a. Thereafter, the same system glass slurry was wrapped about the first mould glass layer 17a and sintered at 685° C. for 5 minutes to form a second mould glass layer 17b.

The crystallizable-type glass has a property as explained in the foregoing, such that the thermal expansion coefficient is decreased as the sintering temperature increases, so that the first and second mould glass layers are obtained to have thermal expansion coefficients as shown in FIG. 2. In the above example, the thermal expansion coefficients of the first and second mould glass layers were $4.0 \times 10^{-6}$/°C. and $4.5 \times 10^{-6}$/°C., respectively.

In general, in order to provide the mould glass with sufficient resistance against compression or tension stress due to thermal stress, it is necessary to determine the thickness of mould glass as large as one to two times the radius of the semiconductor assembly. In the last example, the second mould glass may have a relatively large thermal expansion coefficient. This means that glass slurry may be wrapped and sintered at a relatively low temperature, maintaining high viscosity, to form a sufficiently thick second mould glass layer on the first mould glass layer, thereby completing a glass mould layer structure of a desired thickness having only two mould glass layer. A mould glass structure of three or more layers may be used, in which case the thermal expansion coefficient of each of the mould glass selected in such a manner that the thermal expansion coefficient of the mould glass layer disposed closer to the rectifier unit member is smaller and closer to that of the semiconductor assembly.

Preferably, the difference in thermal expansion coefficients between the semiconductor assembly and the first mould glass layer is substantially not larger than $0.5 \times 10^{-6}$/°C., and the difference in thermal expansion coefficients between the first and second mould glass layers is substantially in the range of $0.2 \times 10^{-6}$/°C. to $0.5 \times 10^{-6}$/°C.

Figure 3:
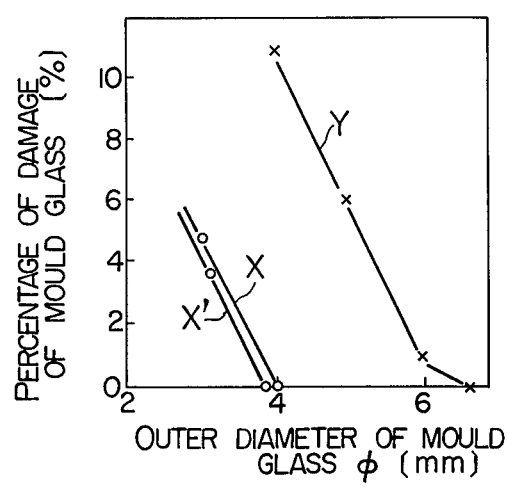
FIG. 3 is a graph showing the relation between thickness and percentage of damage of a mould glass.

Turning to FIG. 3, the relation between the outer diameter of the mould glass and percentage of damage thereof will be discussed. Samples X and Y of semiconductor device have each a semiconductor assembly including a lamination of 15 sheets of 2 mm diameter semiconductor pellet. In the sample X, crystallizable-type glass principally containing $ZnO$, $B_2O_3$ and $SiO_2$ is wrapped about the rectifier unit member and sintered at 700° C. for 5 minutes to form a first mould glass layer, and the same type of glass is wound about the first mould glass layer and sintered at 690° C. for 5 minutes, thus completing a mould glass structure having an outer diameter of 4 mm. A test wherein the sample X thus prepared was subjected to thermal shock at 260° C. showed that percentage of damage was 0% for this mould glass structure. In the sample Y, glass of the same type is wrapped about the same semiconductor pellet and sintered at 690° C. for 5 minutes to form a first mould glass layer, and the same type glass is wrapped about the first mould glass layer and sintered at 690° C. for 5 minutes to form a second mould glass layer, completing a mould glass structure having an outer diameter of 4 mm. The sample Y was subjected to thermal shock at 260° C. and the result showed that the percentage of damage for this mould glass structure was 11%. For 0% damage percentage, the sample X had an allowable outer diameter of 4.0 to 4.5 mm but the sample Y was required to have an outer diameter of more than 6 mm. Further, a sample X' is prepared by admixing $PbTiO_3$ to any of the first and second mould glass layers (in this case, admixed to the second mould glass layer) which are wrapped and sintered in the same conditions as those of the sample X. In this sample, the relation between the outer diameter of the mould glass and percentage of damage thereof is shown by a curve X' in FIG. 3. As is clear from this figure, the sample X' requires an outer diameter of almost 4.0 mm for obtaining 0% damage for this mould glass structure.

It is to be noted that the samples X and X' correspond to semiconductor devices according to the invention and the sample Y corresponds to a prior art device. As will be seen from the above, according to the invention, the outer diameter of the mould glass structure can be reduced and the semiconductor device can be miniaturized in comparison with the prior art device to attain the same resistance against thermal stress.

Other effects obtainable from the invention are as follows:

(1) Since the mould glass is of a multi-layer structure in which the thermal expansion coefficient slightly differs among the layers, each layer will dissipate and absorb the stress, preventing damage of the mould glass;

(2) A mould glass layer in contact with the rectifier unit member has a thermal expansion coefficient approximating that of the rectifier unit member so that the semiconductor pellet will not become damaged under the application of thermal stress following the sintering of the mould glass. In other words, the remaining outer glass layers can have a large thermal expansion coefficient without causing damage of the semiconductor pellet;

(3) The mould glass of multi-layer structure has a large total thickness sufficient to ensure necessary mechanical strength.

(4) Since thermal expansion coefficient of each of the mould glass layers can be made larger in proportion to outer disposition of each layer, the sintering temperature of the outer layer can be reduced to provide the outer layer with high viscosity, facilitating a thick wrapping of glass slurry. Accordingly, a small number of layers are sufficient for the formation of a thick mould glass;

(5) Since a mould glass layer in contact with the rectifier unit member need not be of high viscosity, good passivation of the rectifier unit member can be achieved if the mould glass has a high ability to facilitate the passivation; and (6) Since the mould glass layers not in contact with the rectifier unit member need not have the ability to facilitate the passivation, it is easy to select the type of glass for these layers.

Obviously, the invention is also applicable to other semiconductors than the rectifier unit member exemplified in the embodiment of FIG. 1.

We claim:

1. A glass-moulded type semiconductor device comprising:

a semiconductor arrangement composed of at least one semiconductor pellet having at least one P-N junction, edges of which are exposed to peripheral surfaces of the semiconductor pellet;

a pair of electrodes secured to opposite ends of said semiconductor arrangement through a brazing material;

a first mould glass layer secured to the entire circumferential surface of said semiconductor arrangement and extending to the surfaces of said electrodes for passivating the P-N junction of said semiconductor arrangement; and a second mould glas in the form of at least one layer secured to the surface of said first mould glass layer by sintering the second mould glass layer on the first mould glass layer after the first mould glass layer is formed, wherein said second mould glass layer has a thermal expansion coefficient sufficiently greater than the thermal expansion coefficient of the first mould glass layer so that after cooling said second mould glass layer following sintering a compressional pre-stress force is exerted by said second mould glass layer on said first mould glass layer, the thermal expansion coefficient of each of said mould glass layers being selected in such a manner that the thermal expansion coefficient of said first glass layer is larger than an apparent thermal expansion coefficient of a semiconductor assembly comprising said semiconductor arrangement and said brazing material, and wherein the thermal expansion coefficient of the second mould glass layer is set to be sufficiently greater than the thermal expansion coefficient of the first mould glass layer so that said compressional pre-stress force exerted by the second mould glass layer on the first mould glass layer will be sufficient to prevent breakage of the first and second mould glass layers during heating and expansion of the first mould glass layer when the semiconductor arrangement is in a conductive condition, said heating and expansion of the first mould glass layer being caused by the contacting relationship between the first mould glass layer and the semiconductor arrangement, and further wherein the difference in thermal expansion coefficients between said semiconductor assembly and said first mould glass layer is substantially not larger than $0.5 \times 10^{-6}/°C.$, and the difference in thermal expansion coefficients between said first and second mould glass layers is substantially in the range of $0.2 \times 10^{-6}/°C.$ to $0.5 \times 10^{-6}/°C.$

* * * * *